United States Patent
Kishino et al.

(10) Patent No.: US 7,668,217 B2
(45) Date of Patent: Feb. 23, 2010

(54) SEMICONDUCTOR LASER DIODE DEVICE

(75) Inventors: Katsumi Kishino, Tokyo (JP); Ichiro Nomura, Tokyo (JP); Tsunenori Asatsuma, Kanagawa (JP); Hitoshi Nakamura, Hachioji (JP); Tsukuru Ohtoshi, Hanno (JP); Takeshi Kikawa, Kodaira (JP); Sumiko Fujisaki, Hachioji (JP); Shigehisa Tanaka, Koganei (JP)

(73) Assignees: Hitachi, Ltd., Tokyo (JP); Sophia School Corporation, Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 11/882,055

(22) Filed: Jul. 30, 2007

(65) Prior Publication Data

US 2008/0049803 A1 Feb. 28, 2008

(30) Foreign Application Priority Data

Aug. 25, 2006 (JP) ............... 2006-228808

(51) Int. Cl.
*H01S 3/04* (2006.01)
*H01S 5/00* (2006.01)

(52) U.S. Cl. .................... 372/43.01
(58) Field of Classification Search ........... 372/43.01
See application file for complete search history.

(56) References Cited

U.S. PATENT DOCUMENTS 5,818,859 A * 10/1998 Miller et al. ......... 372/45.01
6,147,365 A * 11/2000 Fischer et al. ............ 257/78
6,265,734 B1 * 7/2001 Fischer et al. ............ 257/97

FOREIGN PATENT DOCUMENTS

| JP | 8-148765 | 11/1994 |
|---|---|---|
| JP | 2004-95922 | 9/2002 |
| WO | WO 97/18592 | 11/1996 |

OTHER PUBLICATIONS

Maksimov, "Beryllium Chalcogenide Alloys for Visible Light Emitting and Laser Diodes", 2005, Rev. Adv. Mater. Sci., 9, 178-183.*

(Continued)

*Primary Examiner*—Minsun Harvey
*Assistant Examiner*—Joshua King
(74) *Attorney, Agent, or Firm*—Stites & Harbison PLLC; Juan Carlos A. Marquez, Esq.

(57) ABSTRACT

The present invention provides a Be-based group II-VI semiconductor laser using an InP substrate and having a stacked structure capable of continuous oscillation at a room temperature. A basic structure of a semiconductor laser is constituted by using a Be-containing lattice-matched II-VI semiconductor above an InP substrate. An active laser, an optical guide layer, and a cladding layer are constituted in a double hetero structure having a type I band line-up in order to enhance the injection efficiency of carriers to the active layer. Also, the active layer, the optical guide layer, and the cladding layer, which are capable of enhancing the optical confinement to the active layer, are constituted, and the cladding layer is constituted with bulk crystals.

1 Claim, 9 Drawing Sheets

OTHER PUBLICATIONS

Kato, E. et al., "Significant progress in II-VI blue-green laser diode lifetime", Electronics Letters, vol. 34 No. 3, Feb. 5, 1998, 2 pages total.

Waag, A. et al., "Novel beryllium containing II-IV compounds: basic properties and potential applications", Journal of Crystal Growth 184/185, 1998, pp. 1-10.

Kishino, Katsumi et al., "Yellow-green emitters based on beryllium-chalcogenides on InP substrates", Phys. Stat. Sol. © 1, No. 6, 2004, pp. 1477-1486.

Hayami, Koichi et al., "Long life operations of BeZnSeTe/MgZnCdSe II-IV light emitting devices on InP substrates and the investigation of their degradation characteristics", Pretext of 52 th Society of Applied Physics Conference, 31p-ZN-6, 2005, In Japanese with 3 pages of English translation.

Nakai, Yuki et al., "Aging characteristics of II-IV yellow light emitting diodes with beryllium chalcogenide (BeZnSeTe) active layers on InP substrates", Phys. Stat. Sol. (a) 201, No. 12, 2004, pp. 2708-2711.

* cited by examiner

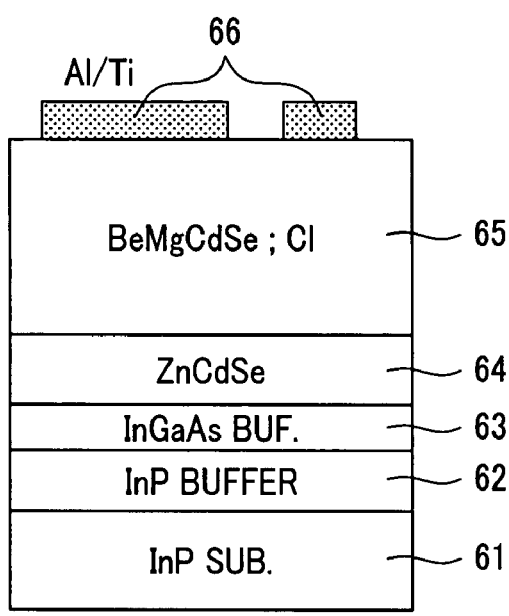
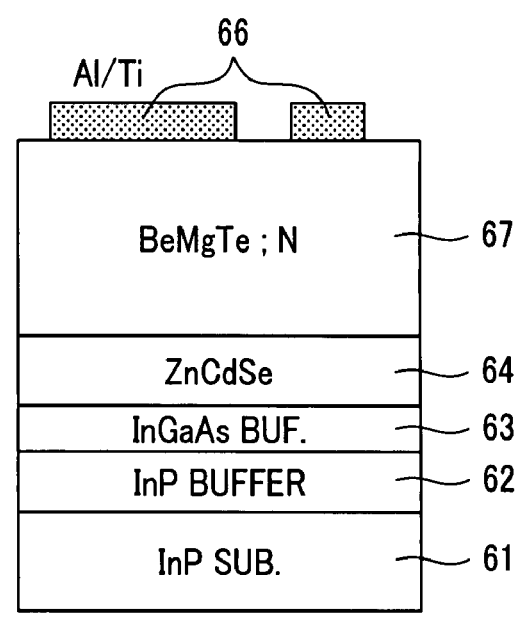

SEMICONDUCTOR LASER DIODE DEVICE

CLAIM OF PRIORITY

The present application claims priority from Japanese application JP 2006-228808 filed on Aug. 25, 2006, the content of which is hereby incorporated by reference into this application.

BACKGROUND OF THE INVENTION

1. Field of the Invention

The present invention relates to a semiconductor laser oscillating at a wavelength in a visible region of green to yellow colors applied to a display or the like, and more particularly to a semiconductor laser with a stacked structure for improving operation characteristics of a semiconductor laser using a compound semiconductor comprising a group II element and a group VI element formed on an InP substrate.

2. Description of the Related Arts

Semiconductor devices emitting light in visible to ultraviolet regions, that is, semiconductor lasers or light emitting diodes are important semiconductor devices in the current society/industrial fields, for example, for use in application to light sources for use in optical information recording devices (compact discs (CDs), digital versatile discs (DVDs), Blu-ray discs (BDs)) and color display apparatuses, and to solid laser excitation, fabrication, sensors, measuring instruments, or medical use, or white lamps. Table 1 shows the outline of wavelength bands and semiconductor materials of optical devices in such application use.

TABLE 1

| Device emitting blue light | Semiconductor device emitting light with yellow to green colors | Device emitting red light | Device emitting infrared light |
|---|---|---|---|
| 400 nm band (esp. 400 to 480 nm) III-V group nitrogen compound semiconductor containing AlGaInN | 500 nm band No appropriate compound semiconductor laser capable of continuous lasing | 600 nm band (esp. 635 to 670 nm) III-V group compound semiconductor containing AlGaInP | 780 nm, 808 nm, 860 nm, 915 nm, 980 nm bands III-V group compound containing AlGa(In)As |

As can be seen from Table 1, for semiconductor devices emitting light from yellow to green colors in a 500 nm band which is a wavelength band intermediate between red and blue colors, not only research and development but also development for materials have not yet been conducted sufficiently. Therefore, semiconductor devices, especially, semiconductor lasers in the wavelength band described above, which have performance sufficient for practical use, have not been achieved.

As semiconductors for use in optical devices, group II-VI semiconductors and group III-V compound semiconductors are useful. However, green-yellow semiconductor lasers have not yet been put to practical use so far. The main reason is that no sufficient reliability has been obtained.

One of the causes for deterioration of devices is multiplication of crystal defects which are macro-defects in a laser active layer portion. Kato et. al have endeavored to decrease stacking faults of ZnSe-based materials formed on a GaAs substrate by devising crystal growing conditions, trially manufactured a laser with no defects in the active layer region and observed device life up to 400 hrs (E. Kato, et al., Electron. Lett. 34, 282 (1998)). It was pointed out that the life was restricted by movement of micro-defects due to compressive strains and micro-defects such as nitrogen doping in p-cladding layers.

In recent years, studies have been started on group II-VI compound semiconductor materials containing beryllium for group II elements as the constituent materials for green-yellow semiconductor lasers (specification of Japanese Patent Laid-open No. H08-148765, WO97/018592, Japanese Patent Laid-open No. 2004-95922, A. Waag et al., Journal of Crystal Growth 184/185 (1998)1-10). The present inventors have trially manufactured a BeZnSeTe-based LED (light Emitting Diode) using beryllium-containing group II-VI semiconductor materials and confirmed a device life of 5000 hrs at a room temperature at a light emitting wavelength of 575 nm, and injection current density of 130 A/cm$^2$ (Kishino et al., Phys. Stat. Sol., 6, (2004) 1477-1486, Hayami et al., Pretext of the 52th Society of Applied Physics Conference, 31p-ZN-6, Yuki Nakai et al., phys. stat. sol (a) 201, 12(2004) pp. 2708-2711). It is considered that the results show a progress toward the practical use of green-yellow semiconductor lasers.

It is considered that the improvement for the reliability in this system is attributable to that a lattice-matched crystal layer could be used by the use of an InP substrate and that crystals are strengthened by the introduction of beryllium to provide an effect of suppressing the multiplication of crystal defects and dislocations. Further, the present inventors have trially manufactured semiconductor lasers by the material constitution identical with that of the LED and confirmed laser oscillation at 77 K pulse driving (Kishino et al., Phys. Stat. Sol., 6, (2004) 1477-1486). However, this structure did not attain continuous oscillation at a room temperature which is necessary for practical use.

SUMMARY OF THE INVENTION

While the BeZnSeTe-based semiconductor laser formed on the InP substrate described above has a possibility of greatly improving the reliability compared with existent group II-VI lasers, they have not attained continuous oscillation at a room temperature as the basic characteristic. The present invention intends to provide a laser structure capable of providing high reliability and room temperature continuous oscillation necessary for practical use. The invention further intends to provide a laser structure also considering the easy crystal growing and improvement in the yield in view of device manufacture.

At first, problems in the conventional art described above are to be explained.

FIGS. 1A and 1B, schematically show a layer structure and the band line-up of a BeZnSeTe-based LED formed on the InP substrate as the conventional art (Kishino et al., Phys. Stat. Sol., 6, (2004) 1477-1486, Hayami et al., Pretext of 52 th Society of Applied Physics Conference, 31p-ZN-6, Yuki Nakai et al., phys. stat. sol (a) 201, 12(2004) pp. 2708-2711). Symbols C.B. and V.B. in FIG. 1B, respectively show a conduction band and a valence band. In FIG. 1B, a bold line shows a mini band formed inside a superlattice.

FIG. 1A, reference numeral 1 denotes an n-electrode comprising Au—Ge; 2, an InP substrate; 3, an InGaAs buffer layer; 4, a Cl doped ZnCdSe buffer layer; 5, a lower cladding layer comprising a Cl-doped MgSe/ZnCdSe super lattice; 6, a thick stepped super lattice layer comprising an MgSe/ZnCdSe super lattice; 7, a BeZnSeTe active layer; 8, an MgSe/ZnCdSe super lattice layer; 9, an upper cladding layer comprising an N-doped MgSe/BeZnTe super lattice; 10, an N-doped BeZnTe/ZnTe super lattice layer; 11, an N-doped ZnTe cap layer; 12, a p-electrode comprising Au; and 13, a dielectric layer.

That is, the structure shown in FIG. 1A has a basic structure of a 3-layered structure in which an MgSe/$Zn_{0.48}Cd_{0.52}Se$ (2 ML (mono layer; molecule layer)/4 ML) n-cladding layer 5 (film thickness: 800 nm) and an MgSe/$Be_{0.48}Zn_{0.52}Te$ (4 ML/6 ML) p-cladding layer 9 (film thickness: 500 nm) are disposed with the $Be_XZn_{1-X}Se_YTe_{1-Y}$ active layer 7 (film thickness: 7.5 nm) centered. The energy at the end of the conduction band (C.B.) of the n-cladding layer 5 is lower than that at the end of the conduction band of the active layer 7 and both of them are in a so-called type II connection.

Therefore, in the case of directly connecting both of them, electrons cannot be injected sufficiently into the active layer 7. Accordingly, an MgSe/$Zn_{0.48}Cd_{0.52}Se$ thickness-graded super lattice layer 6 with the thickness of $Zn_{0.48}Cd_{0.52}Se$ being changed (film thickness: 30 nm) was disposed between both of them.

Further, an MgSe/$Zn_{0.48}Cd_{0.52}Se$ super lattice layer 8 (2 ML/1 ML) (film thickness: 5 nm) was disposed between the active layer 7 and the p-cladding layer 9. This is for preventing the degradation of the active layer during interruption of growing in the crystal growing step. An n-$Zn_{0.5}Cd_{0.5}As$ buffer layer 3 (film thickness: 200 nm) and an n-$Zn_{0.48}Cd_{0.52}Se$ buffer layer (film thickness: 200 nm) were disposed just above the grown InP substrate 2 and an $Be_{0.48}Zn_{0.52}Te$/ZnTe layer 10 (film thickness: 50 nm) and a ZnTe cap layer 11 (film thickness: 5 nm) were disposed just above the p-cladding layer 9.

They are substantially lattice matched with the InP substrate 2 except for the ZnTe cap layer 11.

Although an LED operation for a long time of 5000 hr was confirmed since room temperature continuous oscillation was not obtained in the laser structure in the structure shown in FIGS. 1A and 1B, the reason was examined.

Specimens were prepared while changing the composition of the active layer 7 within a range: 0.08<X<0.19 and 0.26<Y<0.32 and photoluminescence and photocurrent were measured. As a result, it was found that type II light emission at the boundary between the active layer 7 and the n-side graded super lattice layer 6, that is, light emission between the conduction band and the valence band spatially separated in the hetero junction portion occurred and this lowered the emission efficiency in the active layer 7.

To prevent the type II emission, while the thick graded super lattice layer 6 was introduced, the effect was not sufficient and the type II light emission was remarkable at a beryllium composition of 0.08 or higher. Further, in view of the calculation for the optical waveguide, it was found that the optical confinement to the active layer 7 was as low as about 2% in this structure which caused increase in the threshold value of the laser oscillation. This is because the refractive index of the graded super lattice layers 8 and 6 that serve as the optical guide layers on both sides of the active layer 7 is smaller than the refractive index of the p- and n-cladding layers at the outside thereof.

Further, in this example, the cladding layer, etc. were constituted by using the super lattice structure. Use of the super lattice structure makes it possible to simply and conveniently control the band gap in a manner of pseudo mixed crystals by controlling the film thickness. On the other hand, in a case of use for the cladding layer, the carrier conduction in the direction of the film thickness is smaller in a case of the super lattice structure as compared with bulk crystals, which hinders lowering of the resistance. Further, a super lattice structure with a large number of periods gives a burden on crystal growing. With such a view point, a cladding layer and an optical guide layer using bulk crystals instead of the crystals of the super lattice structure are preferred.

In view of the foregoing considerations, the present invention proposes to constitute a green-yellow semiconductor laser under the following guide lines for attaining high reliability and continuous oscillation at a room temperature for putting the green-yellow semiconductor laser into practical use.

(1) To achieve the high reliability, a basic structure of a semiconductor laser is constituted by using a Be-containing lattice matched II-V semiconductor on an InP substrate.

(2) To enhance the injection efficiency of carriers to the active layer, an active layer, an optical guide layer, and a cladding layer are constituted by a double hetero structure having a type I band line-up. Specifically, the band discontinuity values for the conduction band and the valence band in the active layer and the cladding layer are defined respectively as: $\Delta Ec > 300$ meV and $\Delta Ev > 100$ meV.

(3) An active layer, an optical guide layer, and a cladding layer capable of enhancing the confinement of light to the active layer are constituted. Specifically, the refractive index difference between the active layer and the cladding layer is defined as: $\Delta n > 0.1$ and the refractive index of the optical guide layer is set between both of them.

(4) The cladding layer is constituted with bulk crystals.

The reliability is ensured by the guide line (1) and the continuous oscillation at a room temperature is attained by the guide lines (2) to (4). While the guide lines are common guide lines in the field of semiconductor lasers, the invention intends to propose a specific material system of group II-VI semiconductors that satisfy the guide lines and demonstrate the effect thereof. For this purpose, the invention proposes:

(A) to constitute an active layer with BeCdSe and constitute a BeMgCdSe cladding layer above an InP substrate to the BeCdSe active layer with a new material system not reported so far, or proposes (B) to constitute an active layer with ZnSeTe and constitute a BeMgZnTe cladding layer, a BeCdSTe cladding layer, a BeCdSeTe cladding layer, a BeZnSTe cladding layer, or a BeZnSeTe cladding layer above an InP substrate to ZnSeTe with a new material system not reported so far, thereby proposing a green-yellow semiconductor laser capable of attaining continuous oscillation at room temperature.

According to the invention, manufacture of a semiconductor laser that emits light from yellow to green colors of higher practical property than conventional techniques can be attained.

BRIEF DESCRIPTION OF THE DRAWINGS

FIG. 6A is a view showing the structure of a specimen for measuring the carrier concentration in a BeMgCdSe layer;

FIG. 6B is a view showing the structure of a specimen for measuring the carrier concentration in a BeMgTe layer;

DETAILED DESCRIPTION OF THE PREFERRED EMBODIMENTS

In the present invention, based on the physical constants of a binary system group II-VI compound semiconductor reported so far, combination of polynary system group II-VI compound semiconductor mixed crystals that satisfy the guide lines (1) to (4) of the invention described above were at first listed up according to the calculation. Successively, such crystals were prepared, and necessary characteristics were measured and compared with the result of calculation. Finally, the effect of the invention was confirmed by trially manufacturing semiconductor lasers comprising a combination of the polynary system group II-VI compound semiconductor mixed crystals.

At first, the relation between the guide lines (1) to (4) for the invention and the invention are described based on the result of calculation. In the calculation, the lattice constant, the band gap, the refractive index, the energy on the upper end of the valance band and the energy of the lower end of the conduction value of the binary system group II-IV compound semiconductors were used and they were put to linear approximation to determine corresponding constants of the polynary system materials. For three types of material systems used in the invention, the relation between the band structure and the content of the invention is to be described.

Case 1

In a semiconductor laser constituted with a group II-VI semiconductor formed above an InP substrate, the basic constitution of the invention has an active layer comprising BeCdSe as a main component, and has a cladding layer comprising BeMgCdSe as a main component. The constitution satisfies the guide line (1). The feature in this case is that not only the clad but also the active layer have beryllium having an effect of suppressing multiplication of crystal defects and dislocations, and that the relevant group VI element comprises one type and the crystal growing can be controlled easily.

Figure 1A:
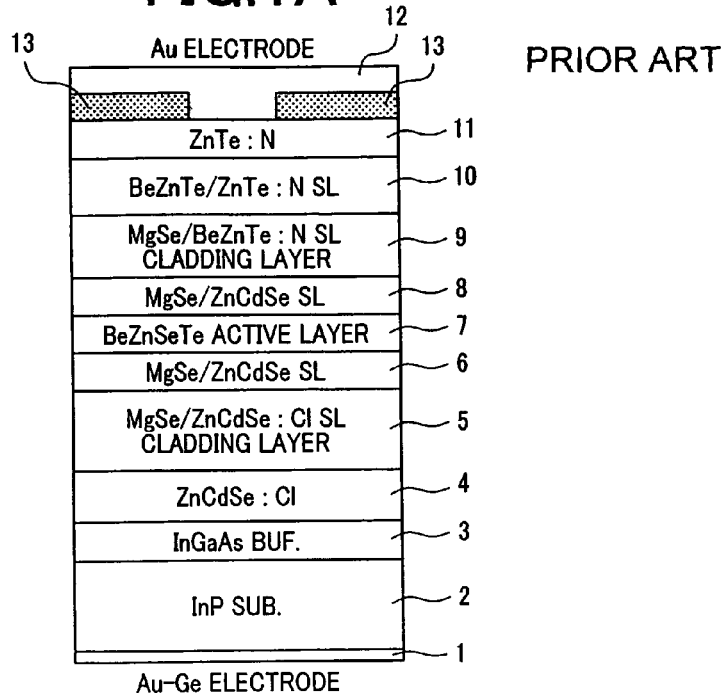
FIG. 1A schematically shows a layer structure of a BeZeSeTe-based LED prepared on an InP Substrate in the conventional art.
Figure 1B:
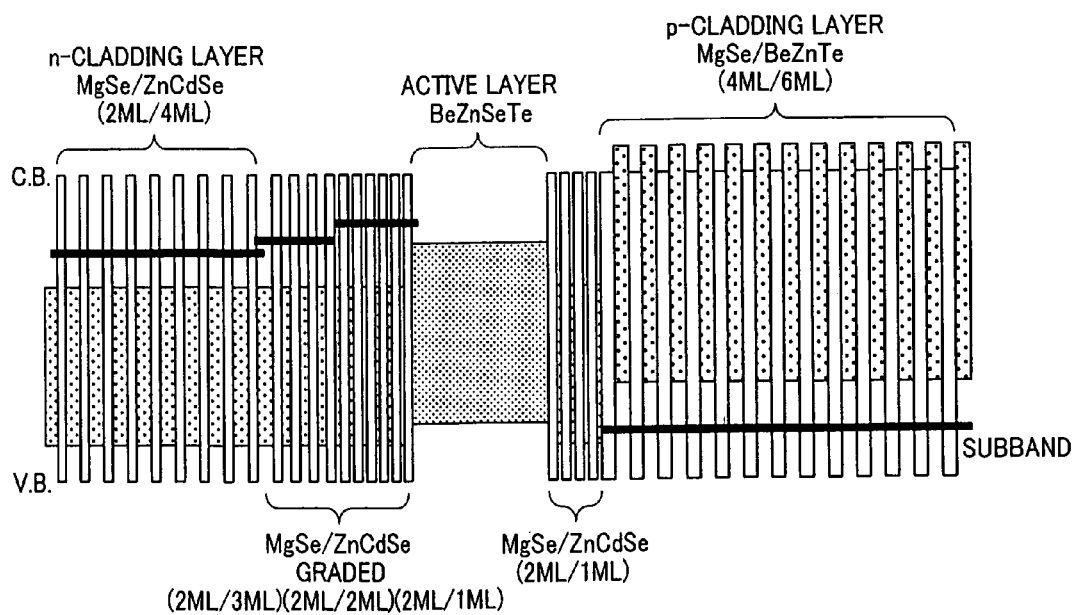
FIG. 1B schematically shows a band line-up of a BeZeSeTe-based LED prepared on an InP Substrate in the conventional art.
Figure 2A:
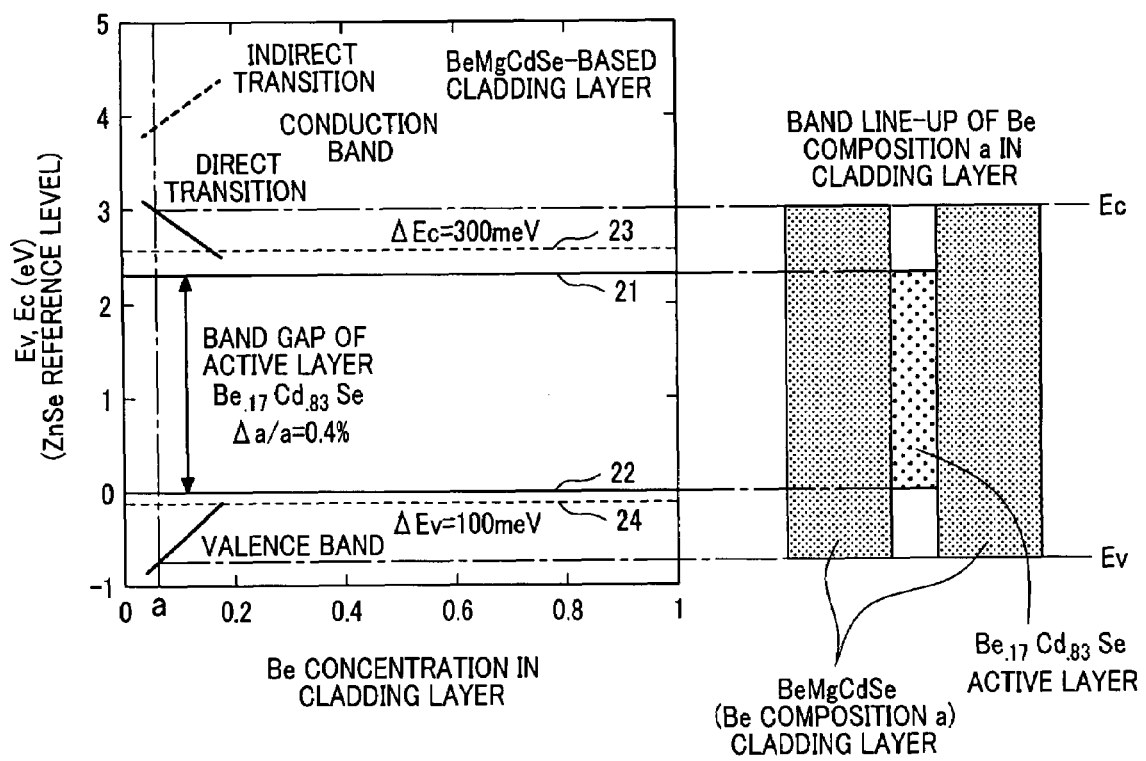
FIG. 2A is a view showing the dependence of the energy level of a conduction band and a valence band in a clad on the beryllium content (atomic %)
Figure 2B:
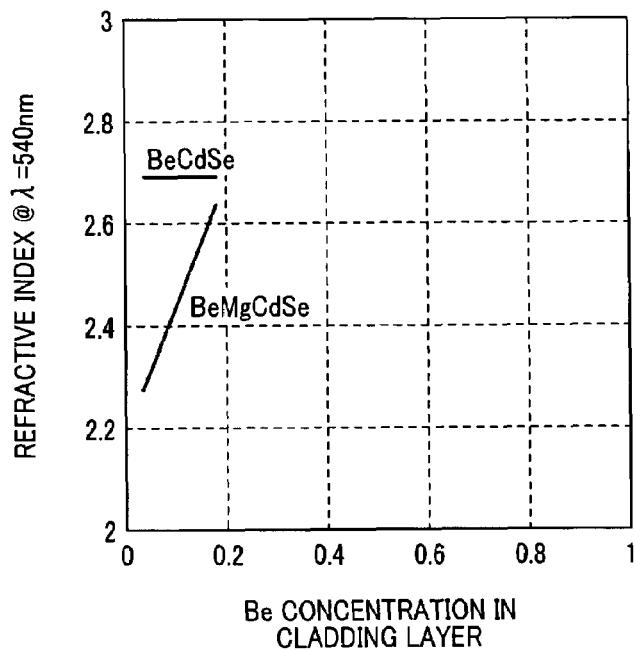
FIG. 2B is a view showing the calculation result (1) for the dependence of the refractive index on the beryllium content (atomic %)

FIG. 2A shows the result of calculation for the dependence of the energy level at a conduction band (Ec) and a valence band (Ev) in the BeMgCdSe clad lattice matched with the InP substrate on the beryllium content (atomic percent). FIG. 2B shows a refractive index at a wavelength of 540 nm corresponding thereto. In the calculation, values for the binary system materials reported so far were used and the energy level of the conduction band and the valance band was shown as a difference with the ZnSe valance band. Further, Table 2 shows numerical value data used for the graphs. This material system is $II_xII_yII_{1-x-y}VI$ type tetranary mixed crystals comprising 3 types of group II elements and 1 type of group VI element and has two degrees of freedom X and Y regarding the composition.

In this case, since lattice matching to the InP substrate is added as one of the conditions, when X (Be composition) is given, Y (Mg composition) and 1-X-Y (Cd composition) are necessarily determined. The ratio of MgSe, CdSe for satisfying the lattice matching condition to the Be composition (BeSe) determined as described above was also shown.

TABLE 2

| BeSe | MgSe | CdSe | Ev(eV) | Ec(eV) | N |
|------|------|------|--------|--------|------|
| 0.04 | 0.9  | 0.06 | −0.85  | 3.08   | 2.28 |
| 0.06 | 0.79 | 0.15 | −0.74  | 3      | 2.34 |
| 0.08 | 0.68 | 0.24 | −0.64  | 2.92   | 2.39 |
| 0.1  | 0.56 | 0.34 | −0.54  | 2.83   | 2.44 |
| 0.12 | 0.45 | 0.43 | −0.43  | 2.75   | 2.49 |
| 0.14 | 0.34 | 0.52 | −0.33  | 2.66   | 2.54 |
| 0.16 | 0.22 | 0.62 | −0.22  | 2.58   | 2.59 |
| 0.18 | 0.11 | 0.71 | −0.12  | 2.49   | 2.64 |

In FIG. 2A, a solid line and a broken line for the conduction band show direct transition and indirect transition. It can be seen that the band gap in the BeMgCdSe clad (difference between Ec and Ev) decreases along with increase in the Be content. It can be seen that Be content Y1 in BeMgCdSe capable of lattice matching with InP is within a range: 0.04<Y1<0.18.

Further, to specifically show the content of FIG. 2A, an example of a band line-up is shown on the right of FIG. 2A. This is an example in the case of the Be composition (BeSe mixed crystal ratio) a. Accordingly, the tetranary material of the Be composition (BeSe mixed crystal ratio) a is used for p-type and n-type clads, and $Be_{0.17}Cd_{0.83}Se$ is used for the active layer. The band line-up is determined by the corresponding energy of the conduction band and the valence band on the left of FIG. 2A as shown by the dotted chain.

Accordingly, a semiconductor laser constituted with the group II-VI semiconductor formed above the InP substrate in which the cladding layer in the basic constitution of the invention described above has a layer comprising $Be_{Y1}Mg_{Z1}Cd_{1-Y1-Z1}Se$ as the main component (0.04<Y1<0.18) lattice matched with the InP substrate is proposed. In this case, only the active layer is defined as a layer comprising BeCdSe as the main component and only the cladding layer is referred to with no particular description to the active layer composition, because it is taken into consideration that the effect of the invention can be attained for the active layer referred to in the case 1, also in the active layer with amendment such as addition of other elements to BeCdSe.

In FIG. 2A, two horizontal lines 21, 22 show the conduction band and the valance band in the layer comprising $Be_{X1}Cd_{1-X1}Se$ as the main component (X1=0.17). The band gap of this composition is 2.3 eV and oscillation at green color is possible. Further, two horizontal broken lines 23, 24 show energy for the conduction band discontinuity value: ΔEc=300 meV and the energy for the valence band discontinuity: ΔEv=100 meV and, accordingly, the upper and lower regions for each of them satisfy the guide line (2). It is also confirmed that refractive index difference Δn>0.1 in the regions from the FIG. 2B and the guide line (3) described above is satisfied.

Accordingly, a semiconductor laser constituted with the group II-VI semiconductor formed above the InP substrate in which the active layer in the basic constitution of the invention described above has a layer comprising $Be_{X1}Cd_{1-X1}Se$ as the main component (0.15<X1<0.20), and a p-cladding layer or an n-cladding layer has a layer comprising $Be_{Y1}Mg_{Z1}Cd_{1-Y1-Z1}Se$ lattice matched with the InP substrate (0.04<Y1<0.14) is proposed. In this case, the allowable range for the composition of the active layer is determined considering the range capable of obtaining the effect of the invention which is practically satisfactory and the manufacturing accuracy in actual device manufacturing steps.

Case 2

In a semiconductor laser constituted with a group II-VI semiconductor formed above an InP substrate, the active layer in another basic constitution of the invention has a layer comprising ZnSeTe as the main component and the cladding layer has a layer comprising BeMgZnTe as the main component in another basic constitution of the invention. Also the constitution satisfies the guide line (1) described above. The feature in this case is that the cladding layer has beryllium having an effect of suppressing the multiplication of crystal defects and dislocations and that the relevant group IV element comprises one type and the crystal growing can be controlled easily.

Figure 3A:
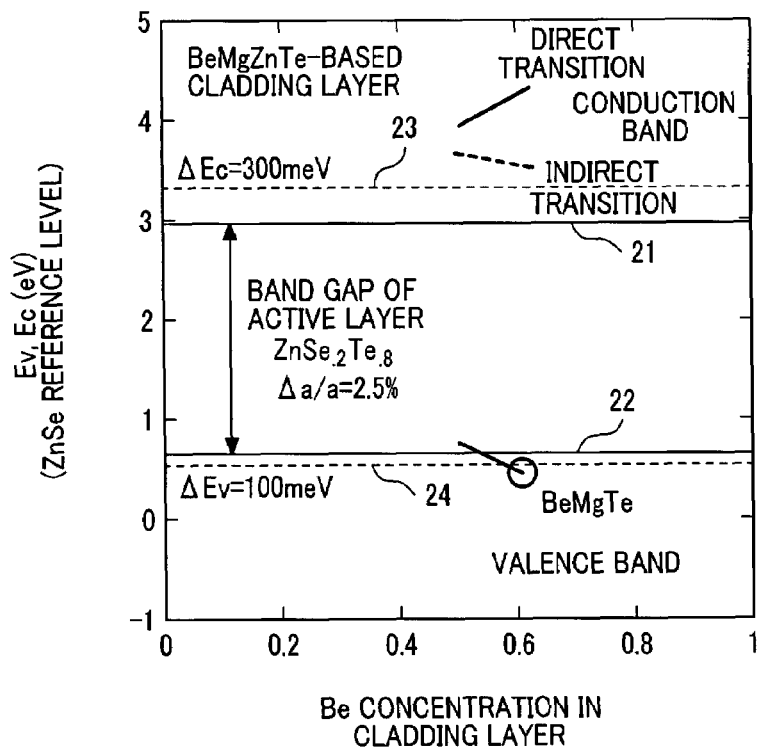
FIG. 3A is a view showing the dependence of the energy level of a conduction band and a valence band in a cladding layer on the beryllium content (atomic %)
Figure 3B:
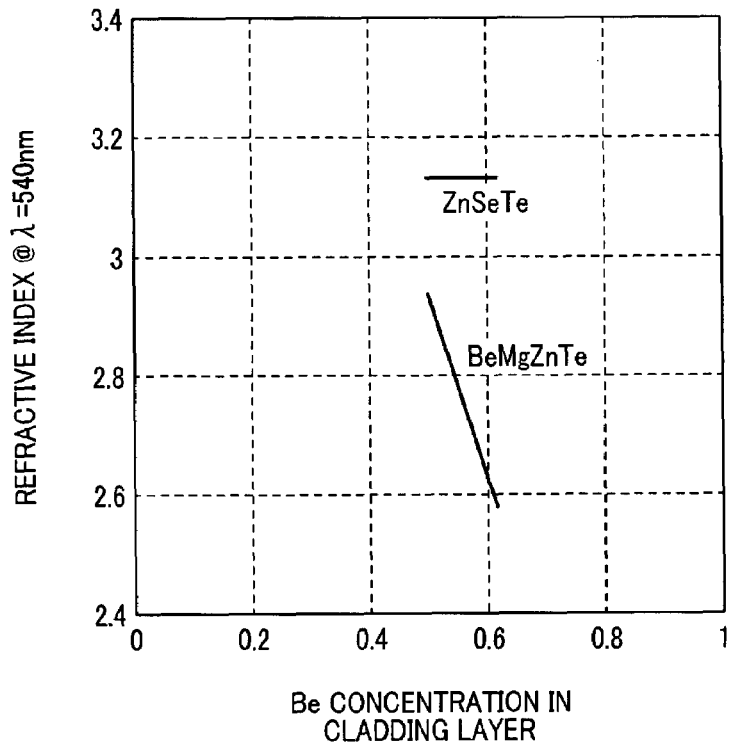
FIG. 3B a view showing the calculation result (2) for the dependence of the refractive index on the beryllium content (atomic %)

FIG. 3A shows the result of calculation for the dependence of the energy level at a conduction band (Ec) and a valence band (Ev) in the BeMgZnTe clad lattice matched with the InP substrate on the beryllium content (atomic percent). FIG. 3B shows a refractive index at a wavelength of 540 nm corresponding thereto. In the calculation, values for the binary system materials reported so far were used, and the energy level of the conduction band and the valance band was shown as a difference with the ZnSe valance band. This material system is $II_xII_yII_{1-x-y}VI$ type tetranary mixed crystals comprising 3 types of group II elements and one type of group VI element and has two degrees of freedom X and Y regarding the composition.

In this case, since lattice matching to the InP substrate is added as one of the conditions, when X is given, 1-x1, Y and 1-X-Y are necessarily determined. FIG. 3 shows numerals data used for the graphs. Also the ratio of MgTe, ZnTe for satisfying the lattice matching condition to the Be composition (BeTe) was also shown.

TABLE 3

| BeTe | MgTe | ZnTe | Ev(eV) | Ec(eV) | N |
|------|------|------|--------|--------|------|
| 0.5  | 0.02 | 0.48 | 0.72   | 3.92   | 2.94 |
| 0.52 | 0.08 | 0.4  | 0.68   | 3.98   | 2.88 |
| 0.54 | 0.13 | 0.33 | 0.64   | 4.05   | 2.82 |
| 0.56 | 0.19 | 0.25 | 0.59   | 4.11   | 2.76 |
| 0.58 | 0.24 | 0.18 | 0.55   | 4.17   | 2.7  |

TABLE 3-continued

| BeTe | MgTe | ZnTe | Ev(eV) | Ec(eV) | N |
|------|------|------|--------|--------|------|
| 0.6  | 0.29 | 0.11 | 0.51   | 4.23   | 2.64 |
| 0.62 | 0.35 | 0.03 | 0.46   | 4.29   | 2.58 |

In FIG. 3A, a solid line and a broken line for a conduction band show direct transition and indirect transition. The feature of the case 2 is that since the group VI in the clad is Te, the energy of the valence band is high to easily attain the p-doping at high concentration and the resistance of the device can be lowered. In FIG. 3A, two horizontal lines 21, 22 show the conduction band and the valence band in the layer comprising $ZnSe_{X1}Te_{1-X1}$ as the main component (X1=0.2). The band gap of the composition is 2.3 eV and can oscillate a green color. Further, two horizontal broken lines 23, 24 show the energy of: the conduction band discontinuity value: ΔEc=300 meV and the valence band discontinuity value: ΔEv=100 meV and, accordingly, the respective upper and lower regions satisfy the guide line (2) described above.

It is confirmed from FIG. 3B that the relation: refractive index difference Δn>0.1 is satisfied in the regions and the guide line (3).

Accordingly, by the same consideration as for the case 1, a semiconductor laser constituted with a group II-VI semiconductor formed above the InP substrate in which the cladding layer in another basic constitution of the invention described above comprises $Be_{Y2}Mg_{Z2}Zn_{1-Y2-Z2}Te$ lattice matched with the InP substrate as the main component (0.50<Y2<0.62) is proposed. The Be concentration (0.50<Y2<0.62) shows a compositional range in which BeMgZnTe can lattice match with the InP substrate.

Further, a semiconductor laser in which the active layer according to other basic constitution of the invention described above has a layer comprising $ZnSe_{X2}Te_{1-X2}$ as the main component (0.15<X2<0.25) and the p-cladding layer as a layer comprising $Be_{Y2}Mg_{Z2}Zn_{1-Y2-Z2}Te$ lattice matching with the InP substrate as the main component is proposed. In this case, Y2=0.62 corresponds to $Be_{0.62}Mg_{0.38}Te$ ternary mixed crystals not containing Zn. In this case, the Be concentration (0.60<Y2<0.62) shows a range in which the BeMgZnTe cladding layer satisfies the guide lines (2), (3), to the $ZnSe_{X2}Te_{1-X2}$ active layer (X2=0.20), that is, the conduction band discontinuity: ΔEc=300 meV, and the valence band discontinuity value: ΔEv=100 meV, and refractive index difference: Δn>0.1.

Case 3

Finally, a semiconductor laser in which a cladding layer of the semiconductor layer is constituted with the group II-VI semiconductor formed above the InP substrate according to other basic constitution of the invention described above has at least one of a layer comprising BeZnSeTe as the main component, a layer comprising BeCdSeTe as the main component, the layer comprising BeZnSTe as the main component and a layer comprising BeCdSTe as a main component is proposed. The constitution also satisfies the guide line (1). The feature in this case resides in that the cladding layer has beryllium having an effect of suppressing the multiplication of crystal defects and dislocations. This material system is $II_xII_{1-x}VI_yVI_{1-y}$ tetranary mixed crystals comprising two kinds of group II elements and two kinds of group VI elements and has two degrees of freedom X and Y regarding the composition. In this case, since lattice matching with the InP substrate is added as one of the conditions, when X (Be composition) is given, Y (Mg composition) and 1-X-Y (Cd composition) are necessarily determined.

Figure 4A:
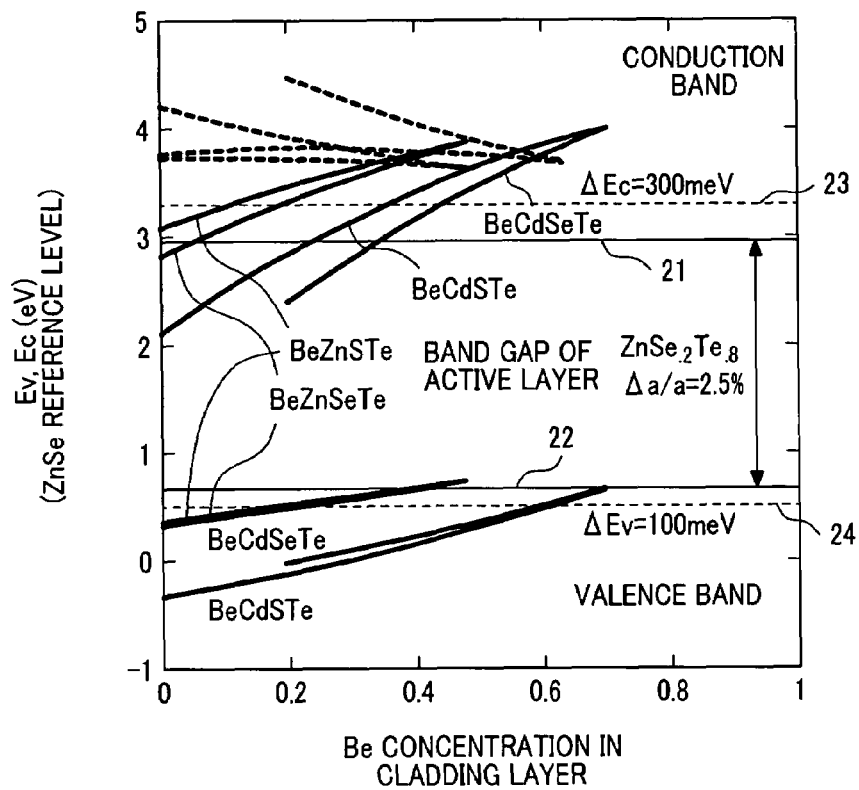
FIG. 4A is a view showing the dependence of the energy level of a conduction band and a valence band in a clad on the beryllium content (atomic %)
Figure 4B:
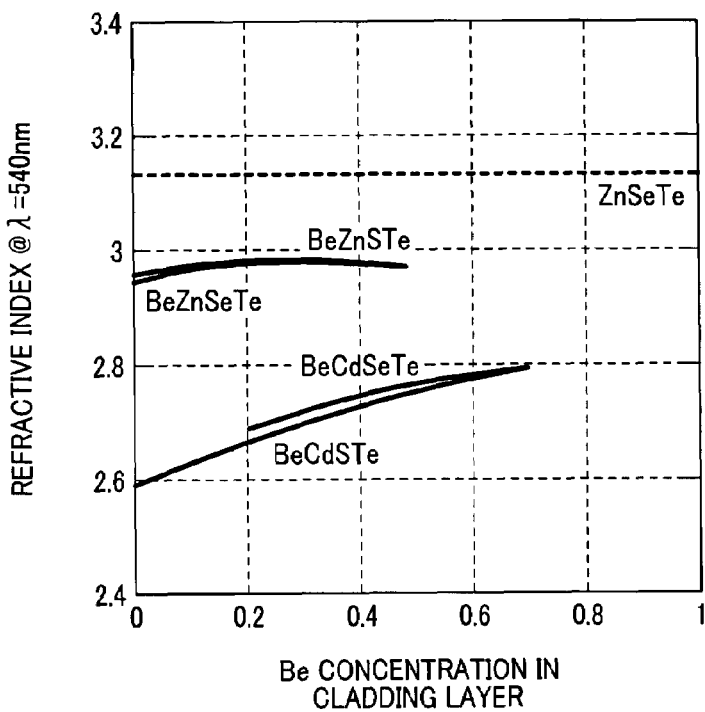
FIG. 4B is a view showing the calculation result (3) for the dependence of the refractive index on the beryllium content (atomic %)

FIG. 4A shows the result of calculation for the dependence of the energy level at a conduction band (Ec) and a valence band (Ev) in the BeZnSeTe, BeCdSeTe, BeCdSTe clads lattice matched with the InP substrate on the beryllium content (atomic percent). FIG. 4B shows a refractive index at a wavelength of 540 nm corresponding thereto. In the calculation, values for the binary system materials reported so far were used, and the energy level of the conduction band and the valance band was shown as a difference with the ZnSe valance band.

In FIG. 4A, a solid line and a broken line for a conduction band show direct transition and indirect transition. In the same manner as in the case 2, the feature of the case 3 is that since the clads include the group VI, the energy of the valence band is high to easily attain the p-doping at high concentration and the resistance of the device can be lowered. In FIG. 4A, two horizontal lines 21, 22 show the conduction band and the valence band in the layer comprising $ZnSe_{X1}Te_{1-X1}$ as the main component (X1=0.2). The band gap of the composition is 2.3 eV and can oscillate a green color. Further, two horizontal broken lines 23, 24 show the energy of: the conduction band discontinuity value: $\Delta Ec=300$ meV and the valence band discontinuity value: $\Delta Ev=100$ meV and, accordingly, the respective upper and lower regions satisfy the guide line (2) described above.

It is confirmed from FIG. 4B that the relation: refractive index difference $\Delta n>0.1$ is satisfied in the regions and the guide line (3).

Accordingly, by the same consideration as in the case 1, a semiconductor laser constituted with the group II-VI semiconductor formed above the InP substrate in which the p-cladding layer according to other basic constitution of the invention described above has at least one of a layer comprising $Be_{Y4}Cd_{1-Y4}Se_{Z4}Te_{1-Z4}$ as the main component (0.20<Y4<0.70), a layer comprising $Be_{Y5}Zn_{1-Y5}S_{Z5}Te_{1-Z5}$ as the main component (0.05<Y5<0.48), a layer comprising $Be_{Y6}Cd_{1-Y6}S_{Z6}Te_{1-Z6}$ as the main component (0.05<Y6<0.70), and a layer comprising $Be_{Y7}Zn_{1-Y7}Se_{Z7}Te_{1-Z7}$ as the main component (0.05<Y7<0.48) is proposed lattice matched with the InP substrate.

Further, in view of the condition satisfying the guide lines (2) and (3), that is, the conduction band discontinuity value: $\Delta Ec=300$ meV, the valence band discontinuity value: $\Delta Ev=100$ meV, and the refractive index: $\Delta n>0.1$, a semiconductor laser constituted with the group II-VI semiconductor formed above the InP substrate in which the active layer according to other basic constitution of the invention described above has at least one of a layer comprising $ZnS_{X3}Te_{1-X3}$ as the main component (0.12<X3<0.22), and the p-cladding layer has at least one of a layer comprising $Be_{Y4}Cd_{1-Y4}Se_{Z4}Te_{1-Z4}$ as the main component (0.46<Y4<0.60), a layer comprising $Be_{Y5}Zn_{1-Y5}S_{Z5}Te_{1-Z5}$ as the main component (0.12<Y5<0.24), a layer comprising $Be_{Y6}Cd_{1-Y6}S_{Z6}Te_{1-Z6}$ as the main component (0.36<Y6<0.62), and a layer comprising $Be_{Y7}Zn_{1-Y7}Se_{Z7}Te_{1-Z7}$ as the main component (0.20<Y7<0.22), lattice matched with the InP substrate is proposed.

In the invention, a so-called superlattice structure is not used for the cladding layer but it comprises the bulk tetranary or ternary crystals as the main component described above in accordance with the guide line (4). Further it is not always necessary in the invention that the active layer and the cladding layer are constituted only with the components described above but the intended effect can be attained in a case where the composition ratio thereof is 80% or more. For example, BeMgCdZnSeTe formed by mixing the cladding layer BeMgCdSe having the composition of the case 1 with the cladding layer BeMgZnTe having the composition of the case 2 at an optional ratio can control the band gap, the conduction band discontinuity value $\Delta Ec$, the valance band discontinuity value $\Delta Ev$, and the refractive index difference $\Delta n$ while satisfying the lattice matching condition to InP. However, it is extremely difficult to control the composition of such a hexanary system material in actual crystal growing which is poor in the practical property. However, controllability can be improved, for example, by devising the apparatus such as a molecular beam epitaxy (MBE) apparatus in view of the number of cells. Further, since MgSe is substantially lattice-matched with InP, mixing of MgSe with the cladding layer is relatively easy. Further, the allowable range for the lattice matching is ±1% in the invention. This is because crystals deteriorate remarkably when the lattice mismatching exceeds ±1%.

Further, in the cases 2, 3 of the invention, ZnSeTe is used as the main component of the active layer. It is possible in this case to add Be and use the BeZnSeTe as the main component of the active layer. In this case, p-clad or n-clad can be selected from BeMgZnTe, BeZnSeTe, BeCdSeTe, BeZnSTe, and BeCdSTe of the cladding materials shown in the cases 2 and 3.

Further, based on the proposals described above, the present invention proposes the guide line regarding the optical guide layer disposed between the active layer and the cladding layer. The optical guide layer satisfies the guide line (3) described above. That is, the optical guide layer is constituted with a material of a composition in which the lattice-matched active layer material and the lattice-matched cladding layer material are mixed at an appropriate ratio. Specifically, the active layer is constituted with $Be_{X7}Cd_{Y7}Zn_{1-X7-Y7}Se_{Z7}Te_{1-Z7}$ as the main component, or the active layer is constituted by a quantum well structure and the well layer of the quantum well is constituted with $Be_{X7}Cd_{Y7}Zn_{1-X7-Y7}Se_{Z7}Te_{1-Z7}$. The n-cladding layer is constituted with the cladding material $Be_{Z8}Cd_{Y8}Zn_{1-X8-Y8}Se_{Z8}Te_{1-Z8}$ described in the cases 2, 3. In this case, by constituting the optical guide layer on the side of the n-cladding layer with A $(Be_{Z7}Cd_{Y7}Zn_{1-X7-Y7}Se_{Z7}Te_{1-Z7})+(1-A)(Be_{X7}Cd_{Y7}Zn_{1-X7-Y7}Se_{Z7}Te_{1-Z7})$ in which 0<A<1, the optical guide layer can be constituted with a material of a composition in which the active layer material and the cladding layer material are mixed at an appropriate ratio. In the same manner, by constituting the p-cladding layer with the cladding material $Be_{X9}Cd_{Y9}Zn_{1-X9-Y9}Se_{Z9}Te_{1-Z9}$ described in the cases 2, 3 and constituting the optical guide layer on the side of the p-cladding layer with B $(Be_{X7}Cd_{Y7}Zn_{1-X7-Y7}Se_{Z7}Te_{1-Z7})+(1-B)(Be_{X9}Cd_{Y9}Zn_{1-X9-Y9}Se_{Z9}Te_{1-Z9})$, in which 0<B<1, the optical guide layer can be constituted with a material of a composition in which the active layer material and the cladding layer material are mixed at an appropriate ratio can be constituted. The optical guide layer as described above have values intermediate of the active layer and the cladding layer for each of the band gap, the energy at the lower end of the conduction band, the energy at the upper end of the valence band, and the refractive index. As a result, the type II connection transported to an exclusive group II-VI growing chamber and irradiation of Zn molecular beams and growing of a low temperature ZnCdSe buffer layer (layer thickness: 100 nm) were conducted at a substrate temperature of 200° C., and then a 500 nm BeZnSeTe layer substantially matched with the InP substrate and a 5 nm ZnTe cap layer were successively stacked at a substrate temperature of 300° C. to prepare a specimen A.

A portion of the specimen was cut out and the ZnTe layer on the surface was removed by Br-system wet etching to prepare a specimen B having BeZnSeTe on the surface.

The composition of BeZnSeTe was identified as $Be_{0.14}Zn_{0.86}Se_{0.38}Te_{0.62}$ from measurement by X-ray diffractiometry or photoluminescence method (HeCd laser excitation, measured at room temperature). The valence band discontinuity value for the case of connecting specimens A and B, that is, ZnTe/BeZnSeTe was evaluated. Photoelectron spectroscopy was used for the measurement. In the measurement, the core level binding energy of the common atom Te of the two specimens was used as the reference and the energy $E_{core/v}$ up to the upper end of each valence band from reference position was measured.

Figure 5A:
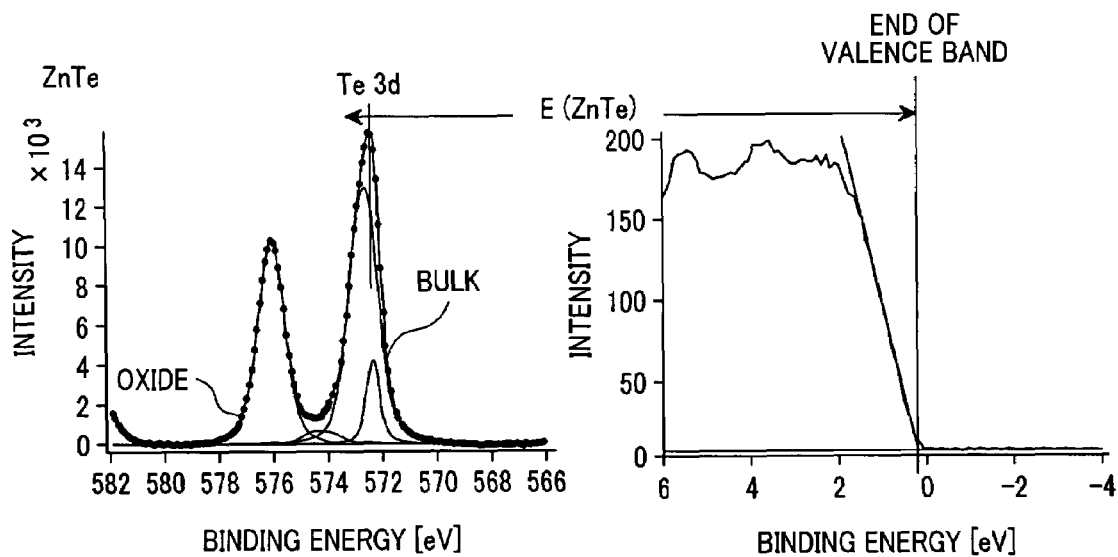
FIG. 5A is a view showing the result of measurement for a band discontinuity value for each of a specimen having ZnTe on the surface and a specimen having BeZnSeTe on the surface by photoelectron spectroscopy.
Figure 5B:
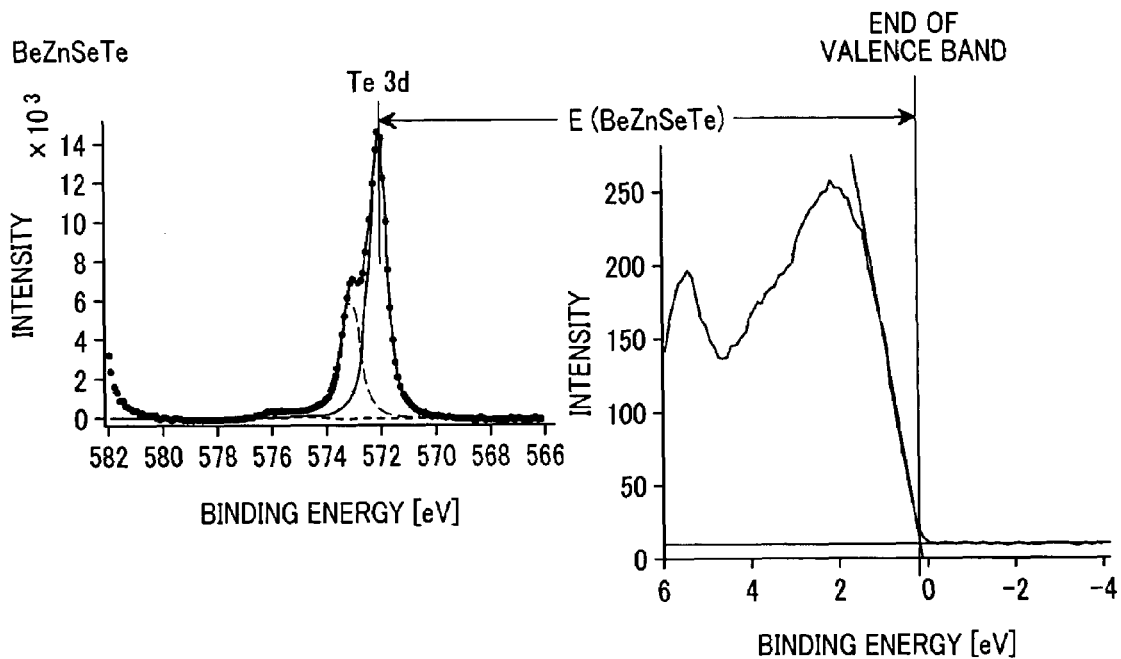
FIG. 5B is a view showing the result of measurement for a band discontinuity value for each of a specimen having ZnTe on the surface and a specimen having BeZnSeTe on the surface by photoelectron spectroscopy.

FIGS. 5A, 5B are views showing the result of measuring band discontinuity values for a specimen having ZnTe on the surface and a specimen having BeZnSeTe on the surface respectively. The left side of the drawing shows signals of the 3d orbit for Te and the right side of the drawing shows signals from the valence band. $E_{core/v}$(ZnTe)=572.32 eV for ZnTe and $E_{core/v}$(BeZeSeT)=572.00 eV for BeZnSeTe. As a result, the valance band discontinuity value ΔEv, that is, the energy difference ΔEv for the upper end of the valance band between both of them is determined as: $E_{core/v}$(ZnTe)−$E_{core/v}$(BeZnSeTe)=0.32 eV. The value showed good agreement with ΔEv=0.30 eV determined from the calculation. Then, the conduction band discontinuity value ΔEc was determined based on the value described above. ΔEc can be determined by using band gaps Eg(ZnTe) and Eg(BeZnSeTe) for ZnTe and BeZnSeTe, based on ΔEc=ΔEv+{Eg(ZnTe)−Eg(BeZnSeTe)}.

In this case, the band gap was determined by the measurement for the photoluminescence and the absorption spectrum. As a result, the conduction band discontinuity value: ΔEc=−0.7 eV of ZnTe/BeZnSeTe was determined. Since the sign is different between ΔEv and ΔEc, it can be seen that the ZnTe/BeZnSeTe hetero junction is the type II connection.

Table 4 shows the valence band discontinuity value ΔEv and the conduction band discontinuity value ΔEc for 4 types of material systems determined by the same measuring method.

TABLE 4

| Case | Cladding layer | | | | Active layer | | | Band discontinuity values | | | |
|---|---|---|---|---|---|---|---|---|---|---|---|
| | BeMgCdSe | | | | BeCdSe | | | ΔEv (ev) | | ΔEc (ev) | |
| | Be | Mg | Cd | Se | Be | Cd | Se | Calculated | Measured | Calculated | Measured |
| 1 | 0.10 | 0.55 | 0.35 | 1.00 | 0.17 | 0.82 | 1.00 | 0.53 | 0.50 | 0.51 | 0.47 |
| | BeMgTe | | | | ZnSeTe | | | ΔEv (ev) | | ΔEc (ev) | |
| | Be | Mg | Zn | Te | Zn | Se | Te | Calculated | Measured | Calculated | Measured |
| 2 | 0.62 | 0.38 | 0.00 | 1.00 | 1.00 | 0.20 | 0.80 | 0.16 | 0.13 | 1.91 | 1.70 |
| | BeCdSeTe | | | | ZnSeTe | | | ΔEv (ev) | | ΔEc (ev) | |
| | Be | Cd | Se | Te | Zn | Se | Te | Calculated | Measured | Calculated | Measured |
| 3 | 0.30 | 0.70 | 0.80 | 0.20 | 1.00 | 0.20 | 0.80 | 0.53 | 0.42 | 0.42 | 0.47 |
| | BeZnSeTe | | | | ZnSeTe | | | ΔEv (ev) | | ΔEc (ev) | |
| | Be | Zn | Se | Te | Zn | Se | Te | Calculated | Measured | Calculated | Measured |
| | 0.17 | 0.83 | 0.33 | 0.67 | 1.00 | 0.20 | 0.80 | 0.13 | 0.10 | 0.90 | 0.85 |

Each of the combination was adopted as BeMgCdSe/BeCdSe for the case 1, BeMgTe/ZnSeTe for the case 2 and BeCdSeTe/ZnSeTe and BeZnSeTe/ZnSeTe for the case 3, respectively. Accordingly, six types of crystal specimens of BeMgCdSe, BeCdSe, BeMgTe, ZnSeTe, BeCdSeTe, and BeZnSeTe were prepared. The preparation procedures are shown below.

At first, after subjecting the InP substrate to an optimal surface treatment, it is set in an MBE apparatus. It is placed in a preparatory chamber for specimen exchange, which is evacuated to $10^{-3}$ Pa or lower by a vacuum pump, and heated up to 100° C. to dissociate the residual water content and impurity gases. Then, it is transported to an exclusive group III-V growing chamber, the oxide film on the substrate surface was removed by heating the substrate temperature to 500° C. while irradiating P molecular beams to the substrate surface, then an InP buffer layer was grown to 30 nm layer thickness at a substrate temperature of 450° C., and then an InGaAs buffer layer was grown to 200 nm layer thickness at a substrate temperature of 470° C. Then, the specimen is transported to an exclusive group II-VI growing chamber and irradiation of Zn molecular beams and growing of a low temperature ZnCdSe buffer layer (layer thickness: 100 nm) were conducted at a substrate temperature of 200° C., and then a layer to be measured was grown to 500 nm to 1,000 nm at a substrate temperature of 300° C.

At first, lattice mismatching to the InP substrate and the band gap were measured for six types of specimens by X-ray diffractiometry, photoluminescence and absorption spectrometry. The band mismatching of the specimens was 1% or less. Table 4 shows the mixed crystal compositions determined by the band gap and the lattice mismatching.

The energy at the upper end of the valance band was determined by the method described above according to photoelectron spectroscopy. The valance band discontinuity value $\Delta Ev$ was calculated by using Te or Se as a common core atom. The conduction band discontinuity value $\Delta Ec$ was determined by using the result and the band gap measured value.

The result is shown in Table 4. $\Delta Ev$, $\Delta Ec$ were 0.50 eV and 0.47 eV for BeMgCdSe/BeCdSe of the case 1, 0.13 eV and 1.70 eV for BeMgTe/ZnSeTe of the case 2, and 0.42 eV, and 0.47 eV for BeCdSeTe/ZnSeTe of the case 3, and 0.10 eV and 0.85 eV for BeZnSeTe/ZnSeTe of the case 3. Table 4 shows the result of calculation determined by the linear calculation for reference. For four types of hetero connection, the result of calculation substantially agreed with the result of measurement.

From the foregoings, it is considered that the result of calculation of FIGS. 2, 3 and 4 have a sufficient accuracy. Each of the values satisfies the basic guide line (2) described above. Accordingly, it can be seen that the compositional range in the invention is effective for the improvement of the characteristics of Be-containing group II-VI semiconductor lasers.

Then, the result of a doping experiment to the material system for use in the cladding layer of the invention is to be shown.

FIG. 6A shows a structure of a device for use in measurement of a carrier concentration in trially manufactured n-doped BeMgCdSe. For the dopant, $ZnCl_2$ was used and three types of specimens of different doping concentrations were prepared. The preparation procedures are shown below.

At first, after subjecting the InP substrate to an optimal surface treatment, it was set in an MBE apparatus. It is placed in a preparatory chamber for specimen exchange, which is evacuated to $10^{-3}$ Pa or lower by a vacuum pump, and heated up to 100° C. to dissociate the residual water content and impurity gases. Then, it was transported to an exclusive group III-V growing chamber, the oxide film on the substrate surface was removed by heating the substrate temperature to 500° C. while irradiating P molecular beams to the substrate surface, then an InP buffer layer 62 was grown to 30 nm layer thickness at a substrate temperature of 450° C., and then an InGaAs buffer layer was grown to 200 nm layer thickness at a substrate temperature of 470° C. Then, the specimen was transported to an exclusive group II-VI growing chamber, Zn molecular beams were irradiated and ZnCdSe low temperature buffer layer 64 was grown to 100 nm layer thickness and then a BeMgCdSe layer 65 was stacked to 0.5 μm layer thickness at a substrate temperature of 300° C. For n-doping, growing was conducted while applying $ZnCl_2$. The composition determined by X-ray diffractiometry or photoluminescence was $Be_{0.14}Mg_{0.30}Cd_{0.56}Se$ and the band gap was 3.0 eV.

Then, two Schottky electrodes 66 as shown in FIG. 6A were formed by vapor deposition of Ti and Al, and patterning by resist and optical exposure. By using the electrodes, measurement was conducted by a capacitance-voltage (C-V) method at a room temperature to determine the effective donor (n-doping) concentration at the BeMgCdSe layer 65. The maximum doner concentration obtained was $1\times10^{18}$ $cm^{-3}$. The result shows that the BeMgCdSe is applicable to the n-clad of the semiconductor laser according to the invention.

FIG. 6B shows a structure of a device for use in measurement of a carrier concentration in trially manufactured p-doped BeMgTe. For the dopant, radical nitrogen doping was used and four types of specimens of different doping concentrations were prepared. The preparation procedures are shown below.

After subjecting the InP substrate 61 to an optimal surface treatment, it was set in an MBE apparatus. It was placed in a preparatory chamber for specimen exchange, which was evacuated to $10^{-3}$ Pa or lower by a vacuum pump, and heated up to 100° C. to dissociate the residual water content and impurity gases. Then, it was transported to an exclusive group III-V growing chamber, the oxide film on the substrate surface was removed by heating the substrate temperature to 500° C. while irradiating P molecular beams to the substrate surface, then an InP buffer layer 63 was grown to 30 nm layer thickness at a substrate temperature of 450° C., and then an InGaAs buffer layer was grown to 200 nm layer thickness at a substrate temperature of 470° C. Then, the specimen was transported to an exclusive group II-VI growing chamber, Zn molecular beams were irradiated and low temperature ZnCdSe buffer layer 64 was grown to 100 nm layer thickness at a substrate temperature of 200° C. Then a BeMgTe layer 67 was stacked to 0.5 μm layer thickness at a substrate temperature of 300° C. For p-doping, radical nitrogen source was used. The composition determined by X-ray diffractiometry or photoluminescence was $Be_{0.63}Mg_{0.37}Te$ and the band gap was 3.8 eV.

Then, two Schottky electrodes 66 as shown in FIG. 6A were formed by vapor deposition of Ti and Al, and patterning by resist and optical exposure. By using the electrodes, measurement was conducted by a capacitance-voltage (C-V) method at a room temperature to determine the effective donor (p-doping) concentration at the BeMgTe layer. The maximum acceptor concentration obtained was $8\times10^{17}$ cm$^{-3}$. The result shows that the BeMgTe is applicable to the p-clad of the semiconductor laser according to the invention.

Specific embodiments of the semiconductor laser according to the invention are shown below.

First Embodiment

Figure 7:
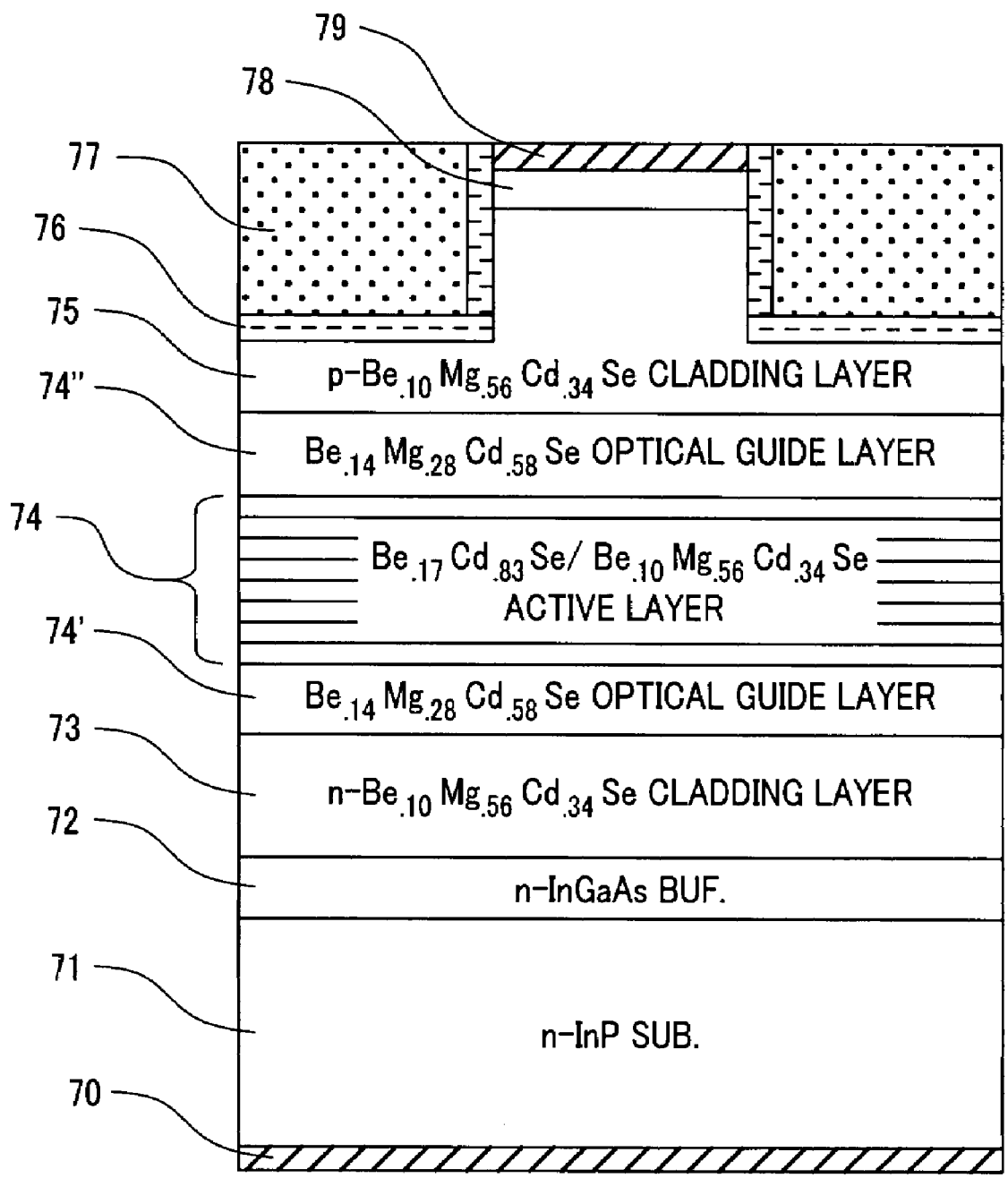
FIG. 7 is a view showing a structure of a ridge type green semiconductor laser according to a first embodiment of the invention.

FIG. 7 shows a structural view of a ridge type green semiconductor laser of the first embodiment according to the invention. In the first embodiment, material constitutions shown previously for the case 1 is applied. In FIG. 7, reference numeral 71 denotes an n-InP substrate; 72, an n-InGaAs buffer layer (film thickness: 0.5 µm); 73, an n-$Be_{0.10}Mg_{0.56}Cd_{0.34}Se$ cladding layer (film thickness: 1 µm); 74, an undope active layer including a multiple quantum well structure; 75, a p-type $Be_{0.10}Mg_{0.56}Cd_{0.34}Se$ cladding layer (film thickness: 1 µm); and 78, a p-BeZnTe/ZnTe composition modified superlattice contact layer. The active layer 74 is constituted as a structure where both sides of a multiple quantum well constituted with each three periods of $Be_{0.17}Cd_{0.83}Se$ well layers (film thickness: 5 nm) and $Be_{0.14}Mg_{0.28}Cd_{0.58}Se$ barrier layers (film thickness: 5 nm) are sandwiched by a $Be_{0.14}Mg_{0.28}Cd_{0.58}Se$ optical guide layer (film thickness: 20 nm) 74', 74". An n-electrode 70 is for the AuGeNi/Pt/Au layer and a p-electrode 79 is for the Ni/Ti/Pt/Au layer. A polyimide protective film 76 and an SiN protective film 77 are used respectively for planarizing the upper surface.

For crystal growing, a 2-chamber molecular beam epitaxy apparatus having chambers for group III-V and group II-VI were used. The growing temperatures for group III-V (GaInAs) and group II-VI are 500° C. and 280° C. respectively. Zn irradiation is conducted for suppressing the occurrence of dislocation at the boundary between both of them. $ZnCl_2$ and RF-nitrogen plasma source are used for n- and p-dopants for the group II-VI. To form the ridge, a wet etching is performed with a mixed solution of chromic acid and bromic acid. After forming an SiN protective layer by a plasma CVD method, a polyimide is coated and the upper surface of the device is planarized by etching back using a $CF_4$ asher. Electron beam vapor deposition is used for the formation of the electrodes 70, 79. The width at the upper surface of the mesa is 6 µm and the device length of the laser formed by cleaving is about 800 µm.

The device of the first embodiment oscillates continuously at a room temperature. The oscillation wavelength is 530 nm, the threshold current is 28 mA, and the maximum optical output is 55 mW.

Further, a similar device having $Be_{0.20}Cd_{0.80}Se$ in the p-cladding layer, the n-cladding layer, and the optical guide layer was trially manufactured and compared. While $Be_{0.20}Cd_{0.80}Se$ substantially lattice matched with the InP substrate 71, it is a material out of the BeSe crystal mixing ratio Y ($0.04<Y<0.18$) of the invention. While the trially manufactured device shows continuous oscillation at a room temperature, the threshold current increases nearly by about one digit as 250 mA compared with the foregoing result. This is considered to be a result showing the effectiveness of the invention.

Second Embodiment

Figure 8:
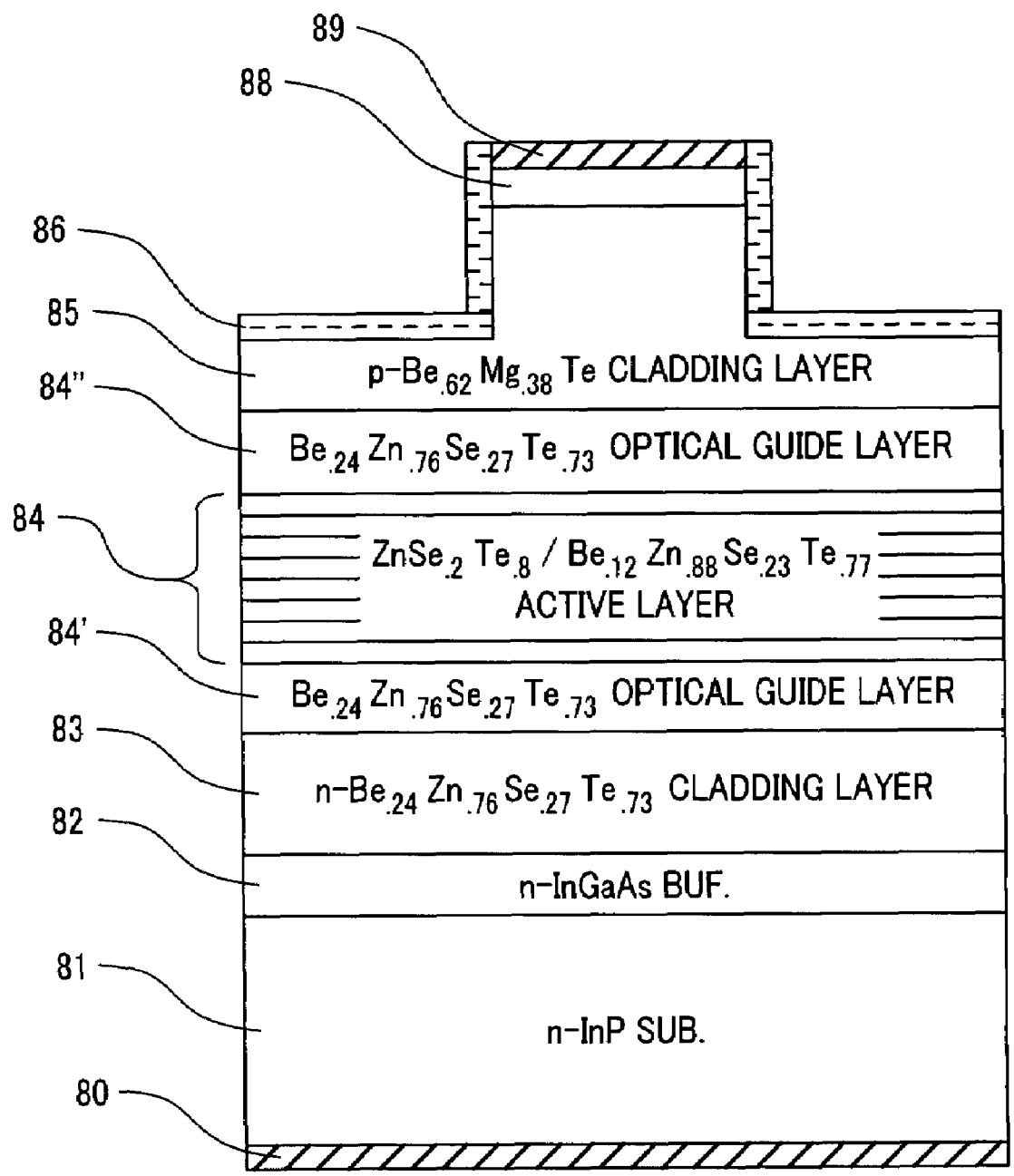
FIG. 8 is a view showing a structure of a ridge type green semiconductor laser according to a second embodiment of the invention.

FIG. 8 shows a structural view of a ridge type green semiconductor laser of the second embodiment according to the invention. In the second embodiment, material constitutions shown previously for the case 2 is applied (the material constitution shown in the case 2 is applied for the second embodiment). In FIG. 8, reference numeral 81 denotes an n-InP substrate; 82, an n-InGaAs buffer layer (film thickness: 0.5 µm); 83, an n-$Be_{0.24}Zn_{0.76}Se_{0.27}Te_{0.73}$ cladding layer (film thickness: 1 µm); 84, an undope active layer including a multiple quantum well structure; 85, a p-type $Be_{0.62}Mg_{0.38}Te$ cladding layer (film thickness: 1 µm); and 88, a p-BeZnTe/ZnTe composition modified superlattice contact layer. The active layer 84 is constituted as a structure where both sides of a multiple quantum well constituted with each three periods of $ZnSe_{0.2}Te_{0.8}$ well layers (film thickness: 5 nm) and $Be_{0.12}Zn_{0.88}Se_{0.23}Te_{0.77}$ barrier layers (film thickness: 5 nm) are sandwiched by a $Be_{0.12}Zn_{0.88}Se_{0.23}Te_{0.77}$ optical guide layers (film thickness: 20 nm) 84', 84". Reference numerals 80, 89 denote an n-electrode for the AuGeNi/Pt/Au layer and a p-electrode for the Ni/Ti/Pt/Au layer respectively, 86 denotes an SiN protective film, and 88 denotes a p-BeZnTe/ZnTe composition modified superlattice contact layer. The device preparation method is identical substantially with the first embodiment except for the polyimide planarizing step.

The device of the second embodiment oscillates continuously at a room temperature. The oscillation wavelength is 550 nm, the threshold current is 40 mA, and the maximum optical output is 40 mW.

Further, a similar device having a composition of $Be_{0.50}Mg_{0.02}Zn_{0.48}Te$ of a p-cladding layer was trially manufactured and compared. While $Be_{0.50}Mg_{0.02}Zn_{0.48}Te$ was substantially lattice matched with the InP substrate, this is a material out of the BeTe mixed crystal ratio Y ($0.60<Y\leq0.62$) of the invention. In the trially manufactured device, the continuous oscillating operation at a room temperature cannot be confirmed. The result is considered to be an example showing the validity of the estimated in the invention.

Third Embodiment

Figure 9:
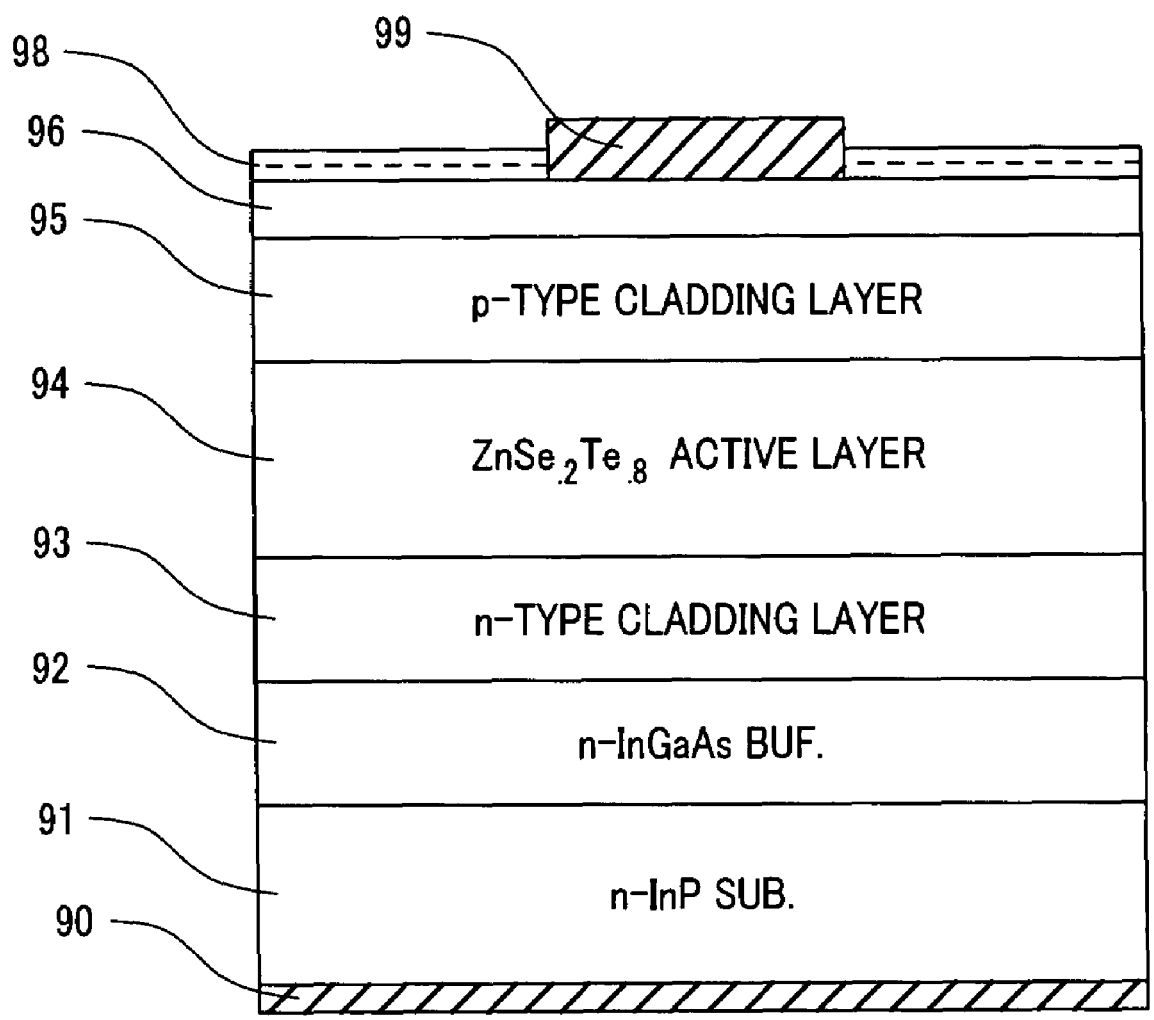
FIG. 9 is a view showing a structure of a dielectric film stripe type green semiconductor laser according to a third embodiment of the invention.

FIG. 9 shows a structural view of a dielectric film stripe type green semiconductor laser of a third embodiment according to the invention. In the third embodiment, the material constitution shown previously in the case 3 is applied. In FIG. 9, reference numerals 91 denotes an n-InP substrate; 92, an n-InGaAs buffer layer (film thickness d=0.5 µm); 93, an n-cladding layer (film thickness: 1 µm); 94, a $ZnSe_{0.2}Te_{0.8}$ undope active layer (bulk single layer); 95, a p-cladding layer (film thickness: 1 µm); and 96, a p-BeZnTe/ZnTe composition modified superlattice contact layer. Reference numerals 90 and 99 denote, respectively, an n-electrode for the AuGeNi/Pt/Au layer and a p-electrode for the Ni/Ti/Pt/Au layer; and 98, an SiN dielectric film for current blocking. The method of preparing the device is basically identical with that in the first embodiment. In the third embodiment, devices of four types A, B, C, and D with the compositional ratio for the n-cladding layer 93 and the p-cladding layer 95 being changed as shown in Table 5 are prepared.

TABLE 5

| Device | Cladding layer | Oscillation at room temperature | Threshold current | Maximum optical output | Oscillation wavelength |
|---|---|---|---|---|---|
| A | $Be_{0.24}Zn_{0.76}Se_{0.27}Te_{0.73}$ | √ | 50 mA | 40 mW | 540 nm |
| B | $Be_{0.24}Zn_{0.76}S_{0.17}Te_{0.83}$ | √ | 55 mA | 40 mW | 545 nm |
| C | $Be_{0.40}Zn_{0.60}Se_{0.60}Te_{0.40}$ | √ | 80 mA | 30 mW | 542 nm |
| D | $Be_{0.40}Zn_{0.60}S_{0.39}Te_{0.61}$ | √ | 70 mA | 25 mW | 535 nm |

Table 5 shows the obtained device characteristics. Each of the devices oscillates continuously at a room temperature, although the threshold current and the maximum optical output are inferior to those of the first and the second embodiments. It is considered that the characteristics of the third embodiment inferior to those of the first and the second embodiments can be improved by replacing the undope active layer 94 which is a bulk single layer of the third embodiment with a multiple quantum active layer.

Since the semiconductor laser oscillating at a green color obtained in the invention has a high visual sensitivity, a display at a high sensitivity with low optical output is possible. Accordingly, compared with existent display systems by a red laser, etc. safety to eyes is improved. Further, by combination with red and blue semiconductor lasers, a full color small-sized display can be constructed. This provides a possibility capable of application to displays in the form not present in the prior art, micro projection devices, spectacle type displays of wearable PC, vehicle mounted front glass projection head up displays, etc.

Description for reference numerals used in the drawings of the application are as shown below.

| | |
|---|---|
| 61 | InP substrate, |
| 62 | InP buffer layer, |
| 63 | InGaAs buffer layer, |
| 64 | ZnCdSe low temperature buffer layer, |
| 65 | BeMgCdSe layer, |
| 66 | Schottky type two electrodes, |
| 67 | BeMgTe layer, |
| 70 | AuGeNi/Pt/Au n-electrode, |
| 71 | n-InP substrate, |
| 72 | n-InGaAs buffer layer, |
| 73 | n-$Be_{0.10}Mg_{0.56}Cd_{0.34}Se$ cladding layer, |
| 74 | undope active layer containing multiple quantum structure, |
| 75 | p-$Be_{0.10}Mg_{0.56}Cd_{0.34}Se$ cladding layer, |
| 76 | SiN protective film, |
| 77 | polyimide, |
| 78 | p-BeZnTe/ZnTe composition modified superlattice contact layer, |
| 79 | Ni/Ti/Pt/Au p-electrode, |
| 80 | AuGeNi/Pt/Au n-electrode, |
| 81 | n-InP substrate, |
| 82 | n-InGaAs buffer layer, |
| 83 | n-$Be_{0.24}Zn_{0.76}Se_{0.27}Te_{0.73}$ cladding layer, |
| 84 | undope active layer containing a multiple quantum structure, |
| 85 | p-$Be_{0.62}Mg_{0.38}Te$ cladding layer, |
| 86 | SiN protective layer, |
| 88 | p-BeZnTe/ZnTe composition modified superlattice contact layer, |
| 89 | Ni/Ti/Pt/Au p-electrode, |
| 90 | AuGeNi/Pt/Au n-electrode, |
| 91 | n-InP substrate, |
| 92 | n-InGaAs buffer layer, |
| 93 | n-cladding layer, |
| 94 | undope active layer, |
| 95 | p-cladding layer, |
| 96 | SiN protective film, |
| 98 | p-BeZnTe/ZnTe composition modified superlattice contact layer, |
| 99 | Ni/Ti/Pt/Au p-electrode. |

What is claimed is:

1. A semiconductor laser comprising an active layer formed above an InP substrate and provided between a p-cladding layer and an n-cladding layer,
   wherein the active layer is constituted with a multi-layer quantum well having a well layer comprising $ZnSe_{0.2}Te_{0.8}$ and a barrier layer comprising $Be_{0.12}Zn_{0.88}Se_{0.23}Te_{0.77}$; and
   wherein the p-cladding layer is constituted with a layer comprising $Be_{0.62}Mg_{0.38}Te$.

* * * * *